(12) United States Patent
Kier et al.

(10) Patent No.: US 8,344,922 B2
(45) Date of Patent: Jan. 1, 2013

(54) DIGITAL-TO-ANALOG CONVERTER WITH CODE INDEPENDENT OUTPUT CAPACITANCE

(75) Inventors: Ryan James Kier, Salt Lake City, UT (US); Paul Talmage Watkins, Salt Lake City, UT (US); Yusuf Aminul Haque, Woodside, CA (US)

(73) Assignee: Crest Semiconductors, Inc., San Jose, CA (US)

( * ) Notice: Subject to any disclaimer, the term of this patent is extended or adjusted under 35 U.S.C. 154(b) by 94 days.

(21) Appl. No.: 12/849,298

(22) Filed: Aug. 3, 2010

(65) Prior Publication Data

US 2012/0032829 A1    Feb. 9, 2012

(51) Int. Cl.
*H03M 1/66* (2006.01)
(52) U.S. Cl. .................................. 341/144; 341/150
(58) Field of Classification Search .................. 341/144, 341/146, 141, 150, 122, 135, 136
See application file for complete search history.

(56) References Cited

U.S. PATENT DOCUMENTS

| | | | |
|---|---|---|---|
| 6,437,720 B1 * | 8/2002 | Yin et al. | 341/150 |
| 6,542,107 B1 * | 4/2003 | Galambos et al. | 341/172 |
| 6,744,392 B2 * | 6/2004 | Melanson | 341/143 |
| 6,778,119 B2 * | 8/2004 | May | 341/144 |
| 7,030,799 B2 * | 4/2006 | Lee et al. | 341/144 |
| 7,369,076 B1 * | 5/2008 | Chung et al. | 341/144 |

* cited by examiner

*Primary Examiner* — Peguy Jean Pierre
(74) *Attorney, Agent, or Firm* — Steven L. Nichols; Van Cott, Bagley, Cornwall & McCarthy P.C.

(57) ABSTRACT

A Digital-to-Analog Converter (DAC) with code independent output capacitance includes circuitry configured to convert a digital input signal to an analog output signal in a manner such that at least one output terminal of the DAC exhibits a constant capacitance value for up to all received values of the digital input signal. A method for converting a digital signal to an analog signal with a DAC includes converting a digital input signal to an analog output signal in a manner such that at least one output terminal of the DAC exhibits a constant capacitance value for up to all received values of the digital input signal.

19 Claims, 6 Drawing Sheets

DIGITAL-TO-ANALOG CONVERTER WITH CODE INDEPENDENT OUTPUT CAPACITANCE

BACKGROUND

Electronic devices typically make use of both analog and digital signals. An analog signal is a continuous signal which may assume any value. A digital signal is one which may assume one of a discrete set of values. A signal may be in the form of an electrical current or a voltage. Electrical current is the measurement of the flow of electrons. Voltage may be defined as the difference between electric potential at two given points.

Electronic circuitry often includes devices for transferring analog signals into digital signals and vice versa. For example, a Digital-to-Analog Converter (DAC) is used to transfer digital signals into analog signals. Some DACs are configured to output a differential signal. A differential signal is output on a positive terminal and a negative terminal. The value of the signal may be taken as the value of the signal on the positive terminal subtracted by the value of the signal on the negative terminal. Similarly, some DACs may be configured to accept complimentary digital signals at their input. Two digital signals are complimentary when the signals are logical compliments of each other. The output of a DAC is often connected to other circuit devices. The performance of such circuit devices is affected by the output capacitance of the DAC.

The output capacitance of the positive and negative terminals of a DAC generally depends on the code used by the DAC as well as the digital input received by the DAC. Thus during normal operation, the output capacitance of the DAC may vary according to the input signal.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
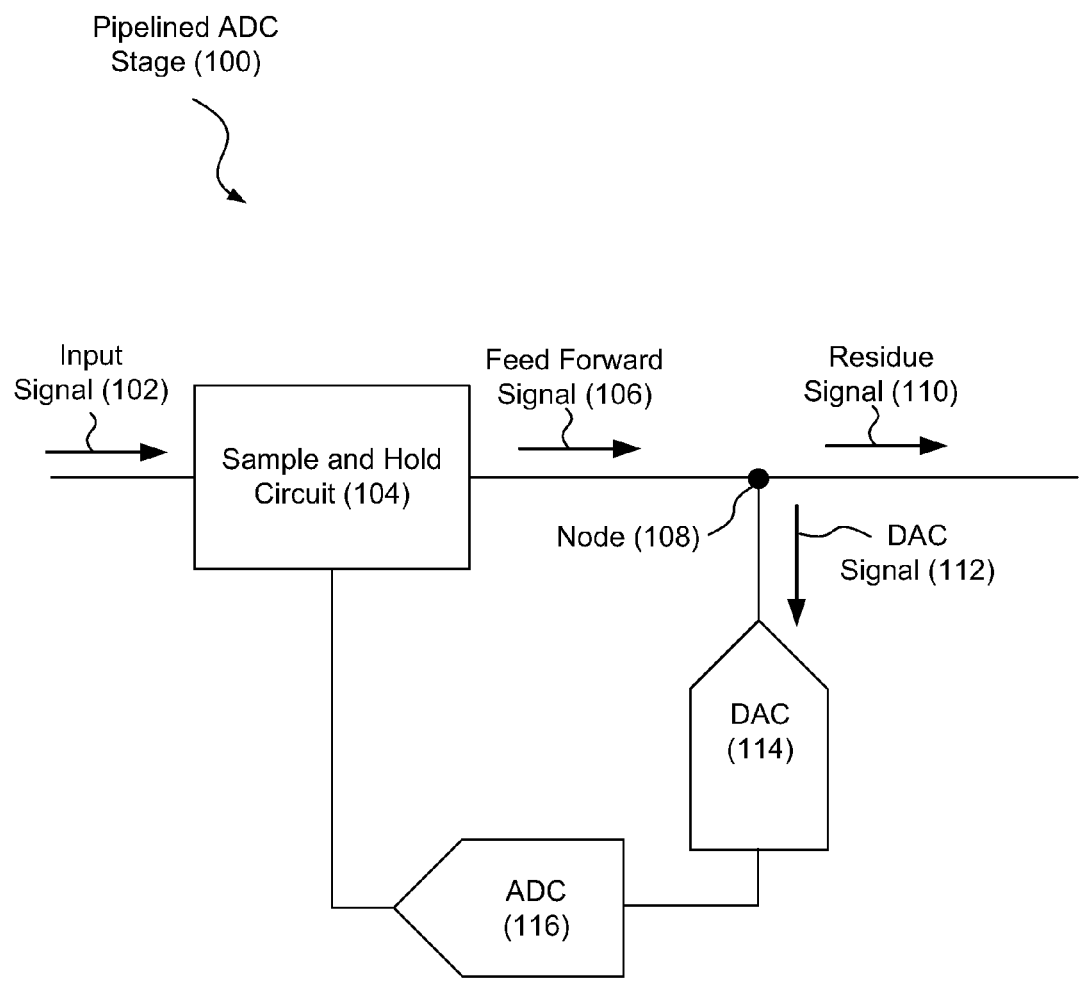
FIG. 1 is a diagram showing an illustrative pipelined analog-to-digital converter stage, according to one embodiment of principles described herein.

As mentioned above, the output capacitance of a DAC may adversely affect the performance of other circuit devices connected to the output of the DAC. For example, a sample and hold circuit may include a differential operational amplifier (op-amp). The settling time associated with the op-amp affects the sampling rate of the sample and hold circuit. It may be demonstrated that an imbalance between the capacitance experienced by the positive and negative output terminals of the op-amp adversely affects the settling time of the op-amp. If the output of the op-amp is connected to the output of a DAC, then balancing the capacitance between either the positive and negative terminals to ground may be difficult as the DAC output capacitance varies during operation.

Code-dependent settling time constants are a leading source of degraded dynamic performance (e.g., SFDR) in high-speed DAC design [Bugeja et al., 1999] A. R. Bugeja, B.-S. Song, P. L. Rakers, and S. F. Gillig, "A 14-b, 100-MS/s CMOS DAC designed for spectral performance," *IEEE J. Solid-State Circuits*, vol. 35, no. 12, pp. 1719-1732, December 1999. This issue is distinct from code-dependent settling time problems that arise from switching transients which may be addressed by techniques described in [Mercer, 2007] D. A. Mercer, "Low-Power Approaches to High-Speed Current-Steering Digital-to-Analog Converters in 0.18-μm CMOS," *IEEE J. Solid-State Circuits*, vol. 42, no. 8, pp. 1688-1698, August 2007.

In light of the above described issue, the present specification relates to a DAC having a code-independent output capacitance on both output terminals. According to certain illustrative embodiments, a DAC includes two sets of current cells arranged in a complimentary manner, such that the output capacitance of the DAC is similar for each received value of a digital signal.

In some embodiments, the complimentary manner includes inverting the digital input signal for one of the set of current cells. For DACs which employ complimentary digital inputs an inversion may be accomplished by simply swapping the complimentary inputs signals for one set of current cells relative to the other. Additionally, the current cells associated with one DAC may be scaled so that the total output of the DAC exhibits a desired common-mode level and a desired step-size.

Through use of an electronic circuit embodying principles herein, a DAC having a constant output capacitance on both output terminals is realized. Such a DAC is advantageous for a variety of reasons. For example, if the output of the DAC is connected to a sample and hold circuit, the sample and hold circuit may have its output terminals connected to output terminals of a DAC having balanced output capacitance. This balance will decrease the settling time experienced by the sample and hold circuit. Having a smaller settling time will allow the sample and hold circuit to operate at higher frequencies.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

As used in the present specification and in the appended claims, the term "signal" is to be broadly interpreted as an electrical signal which may be in the form of an electrical current or a voltage. A signal may refer to either an analog signal or a digital signal.

Referring now to the figures, FIG. 1 is a diagram showing an illustrative pipelined ADC stage (100). A pipelined ADC converts an analog signal into a digital signal using multiple successive stages. According to certain illustrative embodiments, each stage (100) within a pipelined ADC may include a sample and hold circuit (104) a Digital-to-Analog Converter (DAC) (114), and an ADC (116).

A sample and hold circuit essentially operates in two modes. One mode is a "sample" mode, sometimes referred to as a "track" mode. The other mode is a "hold" mode. While the sample and hold circuit is in "sample" mode, the output signal is intended to match the input signal (102). While the sample and hold circuit is in "hold" mode, the output signal is intended to maintain the value experienced by the input at the time the circuit was switched from "sample" mode to "hold" mode. The sample and hold circuit thus produces a sampled output signal.

In one embodiment of a pipelined ADC, one output of the sample and hold circuit (104) is used as a feed forward signal (106). An additional output of the sample and hold circuit (104) may provide a signal to a low resolution ADC (116). The ADC (116) may then pass the digital signal to the DAC (108). The DAC may then create a quantized version of the signal received from the ADC and output that quantized version to a summing node (108). The combination of the feed forward signal (106) and the DAC signal (112) produced by the DAC (114) may produce a residue signal (110). The residue signal (110) may then continue on to a subsequent stage within the pipelined ADC.

If the signals associated with the pipelined ADC are in the form of an electrical current, then the value of the residue signal (110) is in accordance with Kirchhoff's current law. Kirchhoff's current law states that the amount of electrical current entering a node must be equal to the amount of electrical current leaving a node. Thus the summation of the DAC signal (112) and the feed forward signal (106) is equal to the residue signal (110). If current is flowing into a node, it is given a positive value. Conversely, if current is flowing out of a node, it is given a negative value. Thus, the residue signal (110) is equal to the feed forward signal (106) minus the DAC signal (112).

The sample and hold circuit (104) in each pipeline stage (100) holds an analog signal at a specific value for a given period of time. The given period of time is generally designed to be as short as possible while still allowing all of the components within the present stage to process the signal at the held value. As mentioned above, the sample and hold circuit may include two outputs. One output sends the signal to be processed by the ADC and the DAC. The DAC may then produce an output which is combined with the second output from the sample and hold circuit (104). The combination of the feed forward signal (106) and the DAC signal (112) results in the DAC signal (112) being subtracted from the feed forward signal (106). Thus the quantized component of the feed forward signal (106) is removed and the resulting residue signal (110) is sent to the next stage. In some embodiments, the residue signal (110) may need to be amplified before being sent to the next stage for processing.

As the input signal (102) moves through each successive stage (100) in the pipelined ADC, a more precise value can be determined. The number of stages may represent the number of bits used to represent a given signal value. The first stage may represent the most significant bit and the last stage may represent the least significant bit.

In some embodiments, the input signal (102) to a pipelined ADC is a voltage signal. In such an embodiment, the first stage of the pipelined ADC may include a voltage-to-current converter. In some embodiments, the sample and hold circuit (104) may act as a voltage-to-current converter. Such a device may sample a voltage and output a corresponding electrical current.

In certain embodiments, the ADC (116) is a flash ADC. Both the ADC (116) and the DAC (114) can be low resolution devices. Low resolution devices use fewer bits and provide a lower level of precision. High resolution devices may not be necessary to perform the intended functions associated with the ADC (116) and the DAC (114) in each pipeline stage.

A pipelined ADC system may be capable of processing any number of bits needed by a particular application. For example, the ADC and DAC in each stage may be a 4-bit flash ADC and a 4-bit DAC, respectively. Alternatively, each stage may be capable of processing 3 bits, 5 bits or any other practical numbers of bits.

Although the present specification describes the use of a DAC within the context of a pipelined ADC, a DAC embodying principles described herein may be used in a variety of applications. For example, video cards used by many computing systems employ a number of video DACs. These video DACs can utilize principles described herein.

Figure 2A:
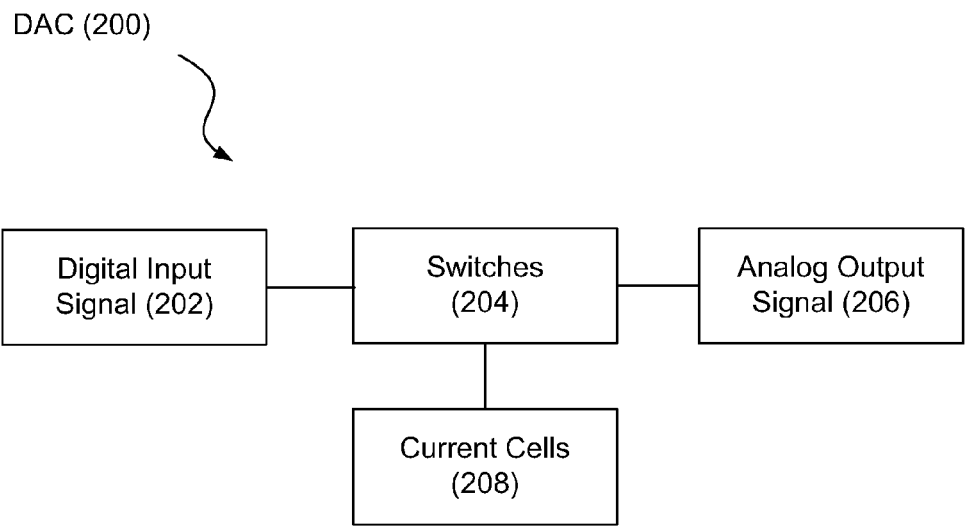
FIG. 2A is a block diagram showing an illustrative abstraction of components of a digital-to-analog converter, according to one embodiment of principles described herein.

FIG. 2A is a block diagram showing an illustrative abstraction of components of a digital-to-analog converter (200). According to certain illustrative embodiments, a DAC may include a number of switches (204) which may open and close based on a received digital input signal (202). The switches currently closed direct electric current from a number of current cells (208). The sum of the electric current from each of the current cells is used to form an analog output signal (206).

A digital signal may be defined as a discrete-time signal. A discrete-time signal is one in which at any given period in time, the value of the signal is represented by a one of a discrete set of values. A discrete set of values is often represented by a binary number system. A given discrete signal value may be represented by a number of bits depending on the resolution of the signal. For example, a four-bit signal may represent a set of up to sixteen discrete values depending on the encoding scheme.

There are several different electronic circuit structures which may perform the function of a DAC. One such structure is a current steering DAC. A current steering DAC is configured to switch the electric current in each cell between a positive and a negative terminal. Thus, the output of a current steering DAC is a differential signal.

For example, in the case that the input signal is a four-bit signal, the DAC includes four switches. Each bit from the signal may correspond to a set of two switches in the DAC. If a given bit is a high signal representing a digital "1," then the corresponding set of switches are configured to steer the electric current from its associated current cell to the positive terminal. Conversely, if a given bit is a low signal, representing a digital "0," then the corresponding set of switches are configured to steer the electric current from its associated current cell to the negative terminal. As will be appreciated by one skilled in the relevant art, various forms of electronic circuitry may be used to control the switches (204).

Based on the state of the switches (204) a number of current sources provide electric current to summing nodes for either the positive or negative output terminals of the DAC. For example, if a switch is receiving a high signal, the associated current source provides a predetermined amount of electric current through the switch to the positive terminal. In some DACs, each switch is connected to a current cell (208) which has been configured to provide a different amount of electric current. For example, the switch (204) corresponding to the most significant bit is connected to a current cell (208) supplying a greater amount of current than the current cell (208) corresponding to the least significant bit. The relative amount of electric current supplied by each current cell (208) may depend on the DAC coding used. For some types of coding, such as thermometer coding, each current cell (208) may supply the same amount of electric current.

A summing node is used to sum the total amount of electric current supplied from each current cell connected through a closed switch to a given terminal. For example, the summing node on the positive terminal will sum the electric current supplied through all the switches receiving a high input signal. Likewise, the summing node of the negative terminal may sum all the electric current supplied through the switches receiving a low input signal. The summing nodes may then be connected to various circuitry configured to process a time-varying signal. Thus, a fully differential analog output signal (206) is realized.

Figure 2B:
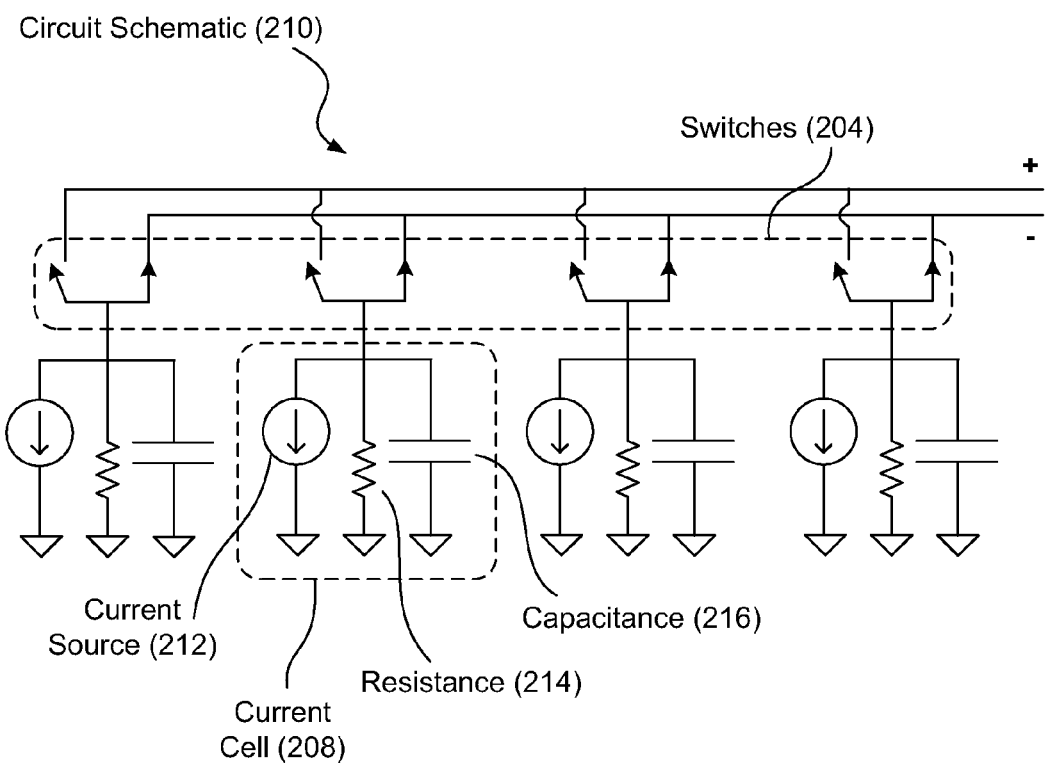
FIG. 2B is a diagram showing an illustrative circuit schematic of some components of a digital-to-analog converter, according to one embodiment of principles described herein.

FIG. 2B is a diagram showing an illustrative circuit schematic (210) of some components of a digital-to-analog converter. According to certain illustrative embodiments, a DAC may include a number of current cells. Each current cell may include a current source (212) with a corresponding output resistance (214) and output capacitance (216).

A current source supplies or absorbs an electric current. Those skilled in the relevant art may appreciate the components which may be used to create a current source. The components forming the current source often exhibit a resistance (214) and a capacitance (216). The resistances (214) and capacitances (216) represent all resistances and capacitances resulting from switch and parasitic resistances and capacitances.

Depending on the digital input signal received, a number of switches (204) will be closed. The total output capacitance of the positive output terminal of a DAC is affected by the capacitances of the current cells (208) which are connected to a switch currently routing electric current to the positive terminal. Likewise, the total output capacitance of the negative output terminal of a DAC is affected by the capacitances of the current cells (208) which are connected to a switch currently routing electric current to the negative terminal. As will be appreciated by those skilled in the relevant art, the total capacitance is equal to the sum of the capacitances in parallel. Thus, as the digital input signal varies and the switches change positions, the output capacitance on each output terminal of the DAC varies.

The value of the current supplied by each current cell relative to other current cells is based on the type of coding used by the DAC. The coding of a DAC refers to the way in which a number of bits represent actual number values. One type of coding which may be used is a thermometer coding. Thermometer coding is a coding in which the value represented is equal to the total number of switches in an ON state. For descriptive purposes, a switch in the ON state may refer to a switch that is routing electric current to the positive output terminal.

In one example, a DAC having four switches may represent five discrete values; all switches off, one switch on, two switches on, three switches on, and all switches on. When using thermometer encoding, all current cells within a DAC may supply the same electric current value.

As mentioned above, it is advantageous to have a DAC with an output capacitance that is balanced between the positive and negative terminals throughout the entire range of operation. The applicant has discovered a circuit configuration that allows a DAC with code independent output capacitance to be realized.

Figure 3:
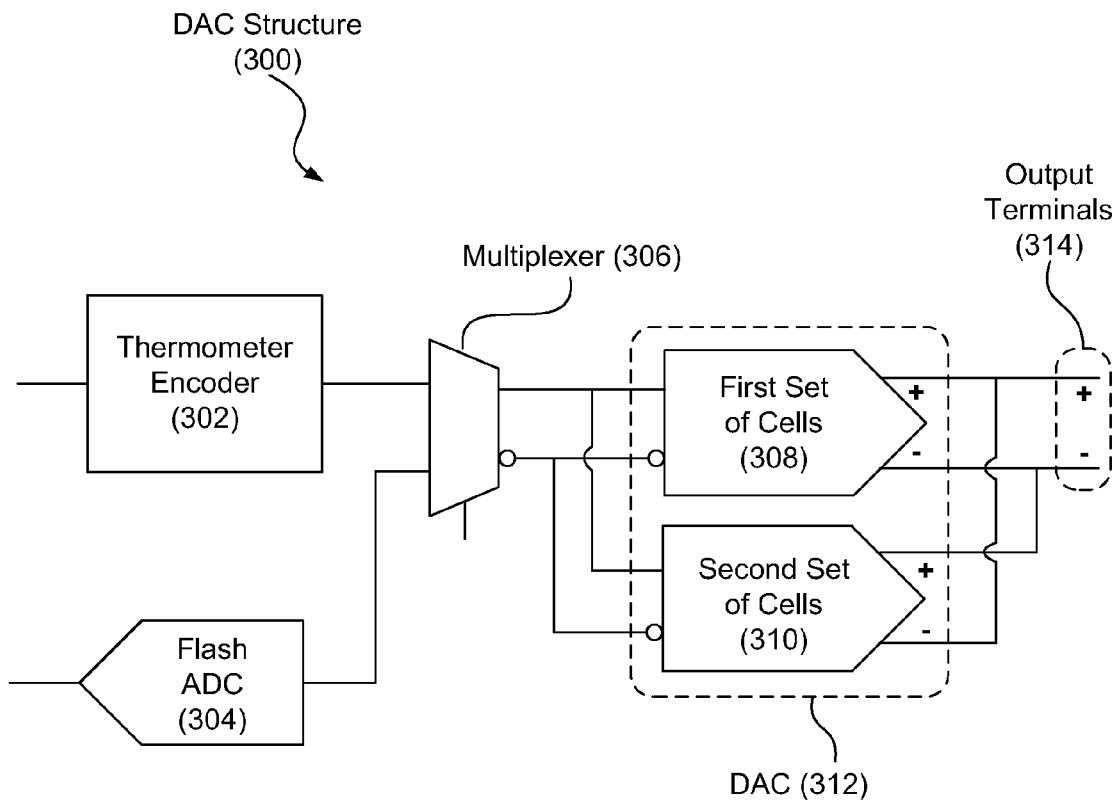
FIG. 3 is a diagram showing an illustrative DAC structure with two complimentary sets of current cells, according to one embodiment of principles described herein.

FIG. 3 is a diagram showing an illustrative DAC structure (300) with two complimentary sets of current cells. According to certain illustrative embodiments, a first set of current cells (308) is used in parallel to a second set of current cells. Both DACs (308, 310) may receive a digital signal from a variety of sources including, but not limited to, a flash Analog-to-Digital Converter (ADC) (304), and a binary to thermometer encoder (302). In some embodiments, the input to the two set of current cells is controlled by a multiplexer (306).

Many digital signals are encoded in binary. Thus, each bit is weighted based on its placement within a group of bits. Digital circuitry can be configured to convert a binary weighted signal into a thermometer encoded signal. The exact details of how such encoding is performed are not relevant to the present specification. Thus a detailed description of such will not be given here.

A flash ADC (304) is one type of device configured to convert an analog signal into a digital signal. A flash ADC (304) is configured to output a digital signal which is thermometer coded. Alternatively, a binary to thermometer code converter (302) can be used to convert a standard binary digital signal into a thermometer coded signal. If multiple input options are available, a multiplexer (306) may be used to select the desired input.

The digital input signal is fed into two sets of current cells (308, 310) placed in parallel with each other. One set of current cells (310) is placed in a complimentary manner to the other set of current cells (308). The complimentary manner is a configuration that allows the output capacitance to be balanced for both output terminals (314) of the DAC (312).

In some embodiments, the complimentary manner is achieved by connecting the negative terminal of the second set of current cells (310) to the positive terminal of the first set of current cells (308). Additionally, the positive terminal of the second set of current cells (310) can be connected to the negative terminal of the first set of current cells (308) as shown in FIG. 3. Thus the combined output capacitance at each terminal will be the same despite the input signal being received. This code independent output capacitance occurs because if the positive terminal is being supplied by one current cell, the negative terminal of the complimentary set of current cells is being supplied with K−1 current cells; K being the number of bits used by the DAC. Thus, when the positive terminal from one set of current cells (308) is connected to the negative terminal from the other set of current cells (310), the total number of closed switches which contribute to the output capacitance of an output terminal of the full DAC (312) may be equal to K despite the received digital input value.

Having two sets of current cells placed in a complimentary manner can allow the capacitance between both output terminals and ground to be the same for all received inputs. However, the value of the output signal will be similar as well. This will provide a constant output value as opposed to an output value that varies depending on the input signal received. To allow the capacitance to remain balanced between the two output terminals and provide an appropriate output signal that varies based on the input signal, the current supplied by each cell within the complimentary set of current cells (310) can be scaled to a particular ratio of the current supplied by each current cell within the first set of current cells (308) and second set of current cells (310).

The ratio of current scaling between the two sets of current cells (308, 310) is configured to provide a desired common mode value and a desired step-size for the output of the DAC. According to some embodiments, the ratio is determined by the following equation:

$$R = -\frac{1 + \frac{2 * C_M}{K * A}}{1 - \frac{2 * C_M}{K * A}} \quad \text{Equation 1}$$

In which:
R=The desired ratio of current supplied by the current cells of each set of current cells (308, 310);
$C_M$=the desired common-mode output level;
K=the maximum DAC input thermometer code; and
A=the desired single-ended step-size for the overall DAC (312).

After having determined R, the value B, denoting the amount of electric current to be supplied by each current cell for the first set of current cells (308) is defined as follows:

$$B = \frac{R * A}{R - 1} \quad \text{Equation 2}$$

Additionally, the value C, denoting the electric current to be supplied by each of the current cells within the second set of current cells (310) is defined as follows:

$$C = \frac{A}{R - 1} \quad \text{Equation 3}$$

Figure 4:
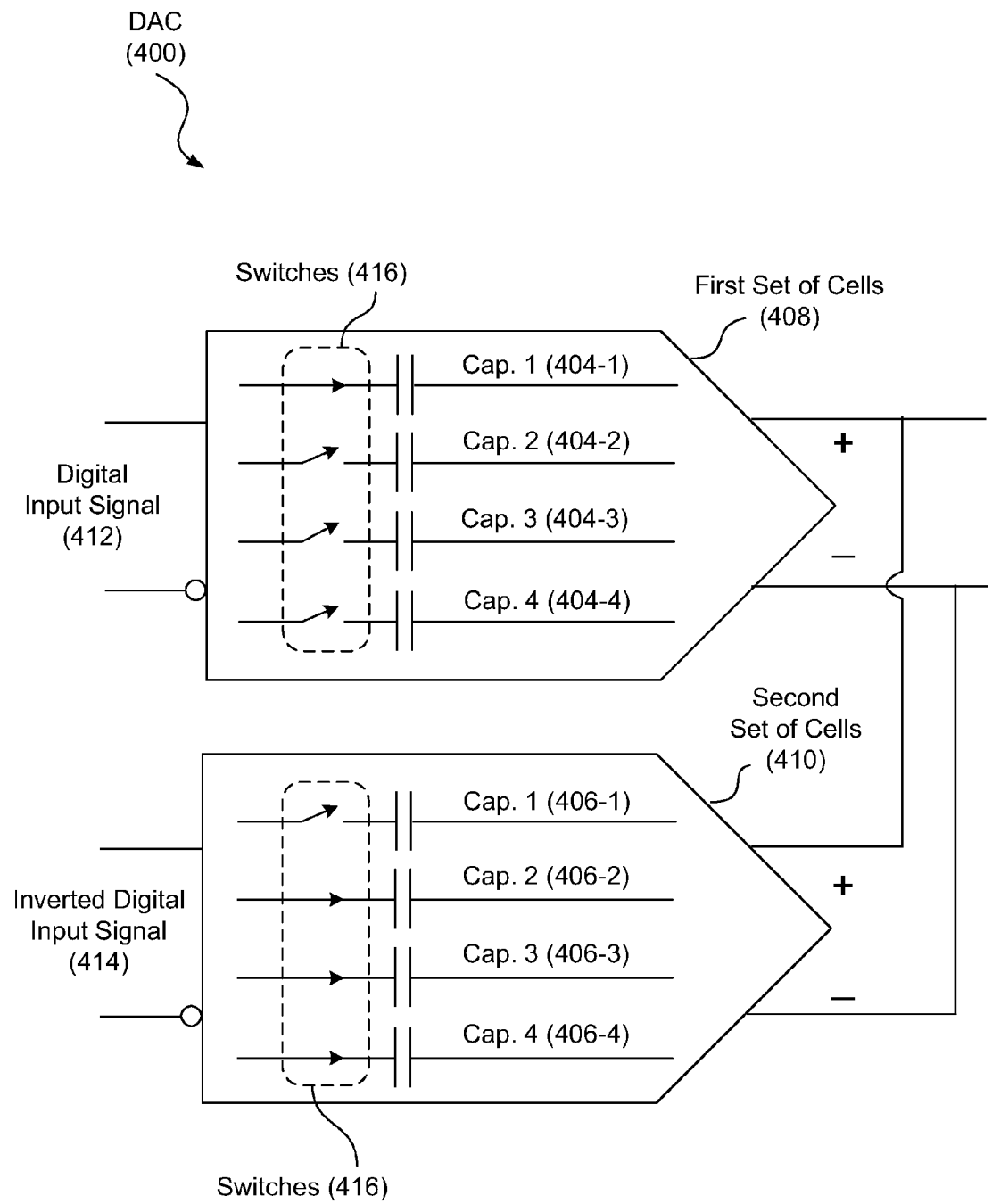
FIG. 4 is a diagram showing two illustrative set of current cells to form a DAC in which one set of current cells is receiving an inverted digital signal, according to one embodiment of principles described herein

FIG. 4 is a diagram showing two illustrative sets of current cells to form a DAC (400) in which one set of current cells is receiving an inverted digital signal (414). According to certain illustrative embodiments, a first set of current cells (408) is configured to receive a digital input signal (412) and a second set of current cells (410) is configured to receive an inverted digital input signal (414).

For illustrative purposes, only a simple overview of the switches (416) and capacitances (404, 406) associated with the set of current cells (408, 410) are shown. An open switch indicates that the electric current is being steered towards a negative terminal, and a closed switch indicates that the electric current is being steered toward a positive terminal.

In one example, each set of current cells receives a four bit signal. If the top most switch of the set of current cells is closed, and the rest of the switches are open, then the total capacitance experienced by the positive output terminal of the first set of current cells (408) comes from capacitance 1 (404-1). The total capacitance experienced by the negative output terminal of the first set of current cells (408) comes from capacitances 2, 3, and 4 (404-2, 404-3, 404-4).

As the second set of current cells (410) is receiving an inverted digital signal, the top most switch is open and the remaining switches are closed. Thus, the total capacitance experienced by the positive terminal of the second set of current cells (410) comes from capacitances 2, 3, and 4 (406-2, 406-3, 406-4). The total capacitance experienced by the negative output terminal of the second set of current cells (410) comes from capacitance 1 (406-1). When the positive outputs from both sets of current cells (408, 410) are combined, the total combined output capacitance results from a total of four capacitances (404-1, 406-2, 406-3, 406-4). Likewise, when the negative outputs from both sets of current cells are combined, the total combined output capacitance also results from four capacitances (406-1, 404-2, 404-3, 404-4). If the devices within each set of current cells are matched so that each current cell has the same output capacitance, then the total output capacitance at each terminal of the full DAC (400) will be balanced.

Figure 5:
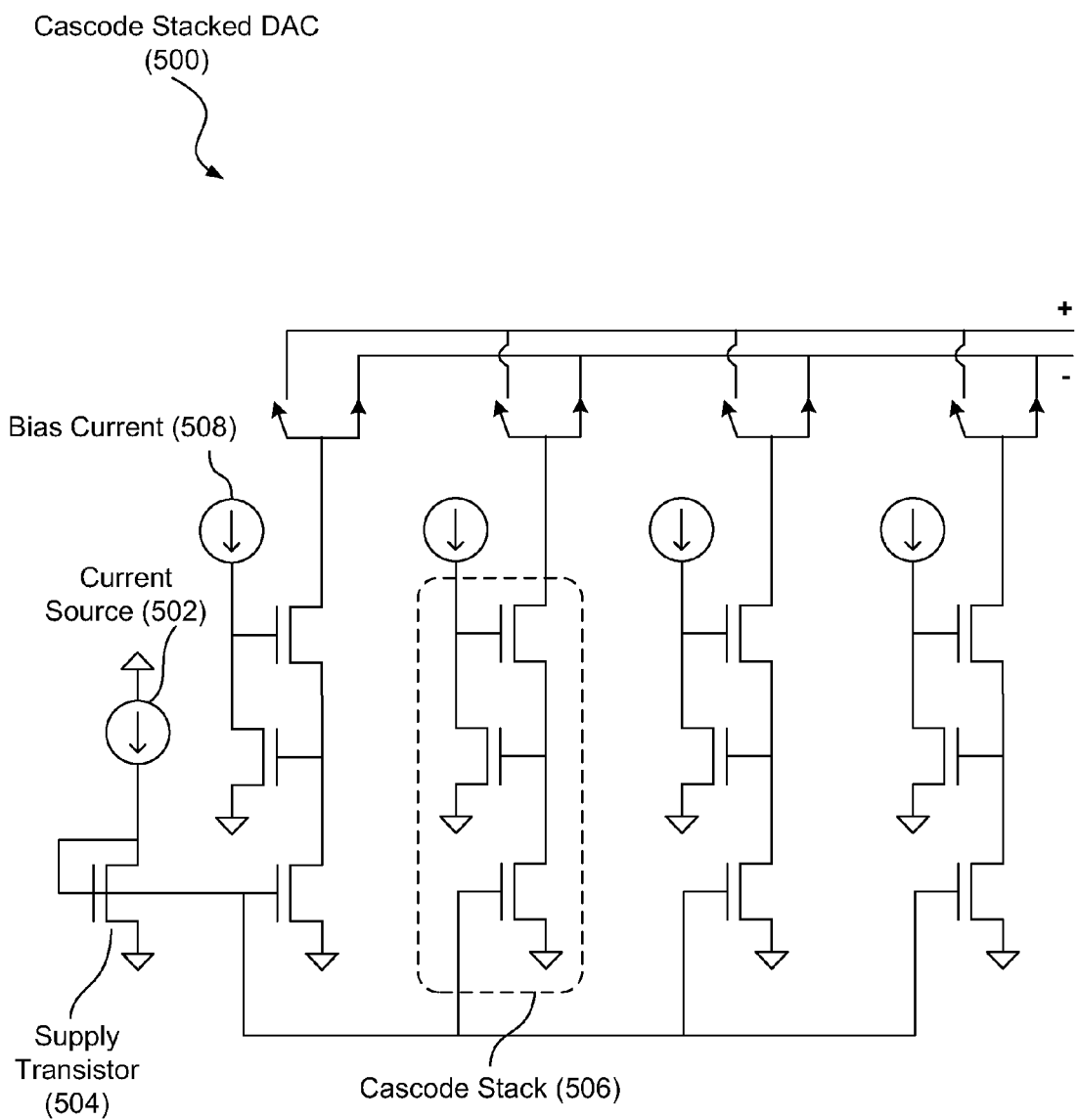
FIG. 5 is a diagram showing an illustrative circuit schematic of a cascode stacked DAC, according to one embodiment of principles described herein.

FIG. 5 is a diagram showing an illustrative circuit schematic of a cascode stacked DAC (500). According to certain illustrative embodiments, a current source (502) may supply current to a supply transistor (504). The supply transistor (504) may then be configured to mirror the received electric current to a number of cascode stacks (506). Each cascode stack (506) is biased by a biasing current source (508).

A cascode stack is made of a number of transistor devices connected as shown in FIG. 5. The exact number of transistor devices in the cascode stack (506) defines the depth of the cascode stack (506). The depth of a cascode stack (506) is limited by the amount of headroom available. The headroom is dependent upon the amount of voltage supplied to the circuit at the positive and negative output terminals. If a signal approaches or exceeds the total amount of voltage supplied to a circuit, then the signal may become distorted. The supplied voltage is split across the number of transistors in the cascode stack. Thus, as more transistors are added to the stack, less headroom is available for each transistor.

The cascode structure illustrated here is merely one type of cascode structure which may be used. A method or system embodying principles described herein may employ any suitable type of cascode structure. Regardless of the cascode structure used, it may be important that the top-most cascode structure of each current cell within each set of current cells be matched so that the capacitance characteristics are similar. Additionally, the characteristics and layout of the transistor devices may be configured to minimize capacitance.

In some embodiments, the switch sizing and characteristics of the switches may be designed to be matched, thus providing similar capacitance characteristics for all current cells of each set of current cells. A method or system embodying principles described herein may employ any suitable switching structure. Additionally, the switching devices may be designed to minimize capacitance subject to the constraint of equal voltage drop for the switches employed in each set of current cells.

Throughout the drawings, transistors are shown as n-type Metal Oxide Semi-conductor Field Effect Transistor (MOSFET) devices. However, a method or system embodying principles described herein may employ other types of transistor devices such as p-type MOSFET devices or Bipolar Junction Transistor (BJT) devices or possibly a combination of other types of devices.

Figure 6:
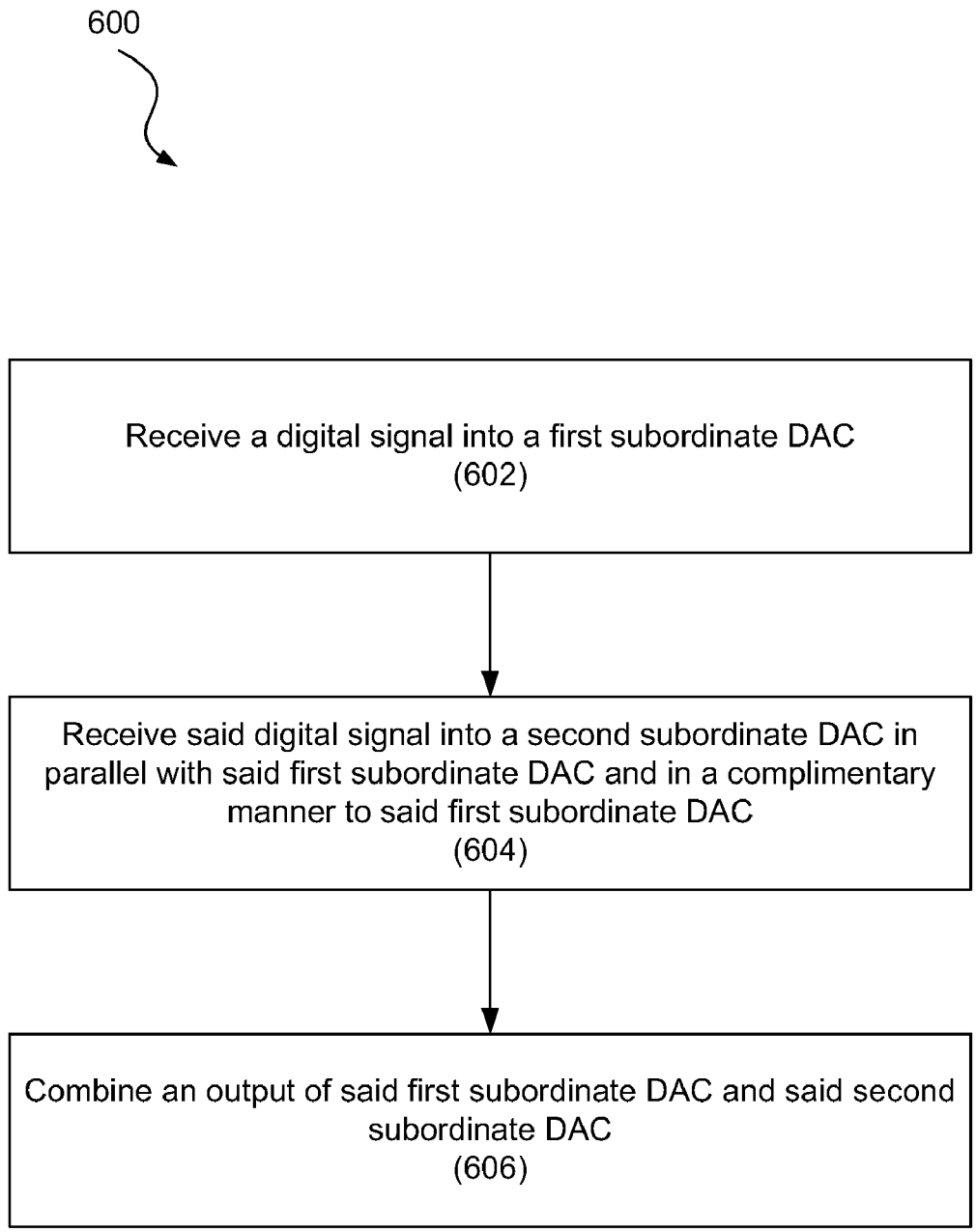
FIG. 6 is a flow chart showing an illustrative method for using a digital-to-analog converter having code independent output capacitance, according to one embodiment of principles described herein.

FIG. 6 is a flow chart showing an illustrative method for using a digital-to-analog converter having code independent output capacitance. According to certain illustrative embodiments, the method (600) may include receiving (step 602) a digital signal into a (first set of current cells; receiving (step 604) the digital signal into a second set of current cells in parallel with the first set of current cells and in a complimentary manner to the first set of current cells; and combining (step 606) an output of the first set of current cells and an output of the second set of current cells. An output capacitance of the DAC may have a consistent capacitance between the output terminals and ground for all received values of a digital signal.

In sum, through use of an electronic circuit embodying principles herein, a DAC having a constant output capacitance on both output terminals may be realized. Such a DAC is advantageous for a variety of reasons. For example, if the output of the DAC is connected to a sample and hold circuit, the sample and hold circuit may have its output terminals connected to output terminals of a DAC having balanced output capacitance. This balance will decrease the settling time experienced by the sample and hold circuit. Having a smaller settling time will allow the sample and hold circuit to operate at higher frequencies.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A Digital-to-Analog Converter (DAC) with code independent output capacitance, said DAC comprising:
    at least two sets of current sources, each current source carrying a ratioed electric current with respect to another of the current sources;
    circuitry configured to convert a digital input signal to an analog output signal in a manner such that at least one output terminal of said DAC exhibits a constant capacitance value for up to all received values of said digital input signal.

2. The DAC of claim 1, in which said at least two sets of current sources comprise:
    a first set of current cells figured to receive and process said digital input signal; and
    a second set of current cells configured to receive and process said digital input signal in a complimentary manner;
    in which the first set of current cells and the second set of current cells comprise a two differential DACs each configured to produce non-zero scaled currents and to produce a constant code-independent output capacitance.

3. The DAC of claim 2, in which an output of said first current cell and an output of said second current cell are combined to produce an output of said DAC.

4. The DAC of claim 2, in which said first set of current cells and said second set of current cells are implemented in a single composite structure.

5. The DAC of claim 2, in which said complimentary manner comprises inverting said input signal before inputting said digital input signal into said second set of cells.

6. The DAC of claim 5, in which inverting said digital input signal is performed by at least one of: use of digital logic circuitry, swapping complimentary signals, and applying complimentary switches.

7. The DAC of claim 2, in which said complimentary manner comprises a positive output of said first set of current cells being connected to a negative output of said second set of current cells and a negative output of said first set of current cells being connected to a positive output of said second set of current cells.

8. The DAC of claim 2, in which said second set of current cells are configured so that electric current supplied by at least one of said second set of current cells is a scaled value of electric current supplied by a current cell within said first set of current cells.

9. The DAC of claim 8, in which said scaled value is configured to cause a combined output of said first set of current cells and said second set of current cells to exhibit a particular common-mode value between at least two output terminals shared by all possible output values of said DAC.

10. The DAC of claim 8, in which said scaled value is configured to cause a combined output of said first set of current cells and said second set of current cells to exhibit a particular step-size between adjacent output values.

11. The DAC of claim 2, in which a current cell within one of said first set of cells and said second set of cells comprises a cascode structure.

12. The DAC of claim 11, in which a transistor device closest to an output node of said cascode structure is configured to minimize capacitance while simultaneously presenting equal capacitance between output terminals of said DAC and a ground.

13. The DAC of claim 2, in which a switching device of one of said first set of current cells and said second set of current cells is configured to minimize capacitance while simultaneously contributing equal capacitance and voltage drop for both said first set of current cells and said second set of current cells.

14. A method for converting a digital signal to an analog signal with a Digital-to-Analog Converter (DAC), the method comprising:
    converting a digital input signal to an analog output signal in a manner such that at least one output terminal of said DAC exhibits a constant capacitance value for up to all received values of said digital input signal, the DAC comprising a first set of current cells and a second set of current cells;
    in which said second set of current cells are configured so that electric current supplied by at least one of said second set of current cells is a scaled value of electric current supplied by a current cell within said first set of current cells.

15. The method of claim 14, in which:
    said first set of current cells are configured to receive and process said digital input signal; and
    said second set of current cells are configured to receive and process said digital input signal in a complimentary manner.

16. The method claim 15, in which said complimentary manner comprises inverting said input signal before inputting said digital input signal into said second set of cells.

17. The method of claim 16, in which inverting said digital input signal comprises at least one of: using digital logic circuitry, swapping complimentary signals, and applying complimentary switches.

18. The method of claim 15, in which said complimentary manner comprises connecting a positive output of said first set of current cells to a negative output of said second set of current cells and connecting a negative output of said first set of current cells to a positive output of said second set of current cells.

19. A Digital-to-Analog Converter (DAC) with code-independent output capacitance, the DAC comprising:
    a first set of current cells; and
    a second set of current cells, in which a positive output of said first set of current cells being connected to a negative output of said second set of current cells and a negative output of said first set of current cells being connected to a positive output of said second set of current cells;

in which said sets of current cells are configured to receive and process a digital input signal in a manner such that at least one output terminal of said DAC exhibits a constant capacitance value for up to all received values of said digital input signal.

* * * * *